United States Patent [19]

Macchetta

[11] 4,220,973
[45] Sep. 2, 1980

[54] TWO-SPEED SEARCHING TELEVISION TUNER

[75] Inventor: Emilio Macchetta, Turin, Italy

[73] Assignee: Indesit Industria Elettrodomestici Italiana S.p.A., Italy

[21] Appl. No.: 927,978

[22] Filed: Jul. 26, 1978

[30] Foreign Application Priority Data

Jul. 26, 1977 [IT] Italy .................. 68737 A/77

[51] Int. Cl.² ........................................... H04N 5/48
[52] U.S. Cl. ............................................... 358/193.1
[58] Field of Search ................................ 334/14–16; 358/191–193; 325/468, 470, 471

[56] References Cited

U.S. PATENT DOCUMENTS

| | | | |
|---|---|---|---|
| 3,456,197 | 7/1969 | Schulz | 325/471 |
| 3,825,838 | 7/1974 | Mayle | 358/193 |
| 3,949,164 | 4/1976 | Murakami et al. | 358/193 |
| 4,008,436 | 2/1977 | Fujita | 325/470 |

FOREIGN PATENT DOCUMENTS

| | | |
|---|---|---|
| 2033478 | 2/1971 | Fed. Rep. of Germany . |
| 2429595 | 1/1975 | Fed. Rep. of Germany . |
| 2246149 | 4/1975 | France . |
| 2325244 | 4/1977 | France . |

OTHER PUBLICATIONS

"Fernseh–Portable mit Suchlauf-Automatik", *Funkschau*, vol. 45, No. 13, Jun. 22, 1973, Munich, Germany, pp. 469–472.

*Primary Examiner*—John C. Martin
*Attorney, Agent, or Firm*—Lerner, David, Littenberg & Samuel

[57] ABSTRACT

A television tuning device having a circuit for continuously scanning at least one frequency band. Scanning can take place at two speeds and controls are provided for starting and stopping the scanning procedure. The scanning speed is automatically changed from high speed to low speed when a television channel is detected to allow ample time for scanning to be stopped manually. Alternatively, the scanning may be stopped automatically.

10 Claims, 2 Drawing Figures

TWO-SPEED SEARCHING TELEVISION TUNER

The present invention relates to a television tuning device, comprising a circuit for continuously scanning at least one band of receivable frequencies, and having control means for starting and stopping the said scanning procedure and a terminal for applying a switch signal for switching from a first band-scanning speed to a second band-scanning speed slower than the first.

The name usually applied to a unit consisting of circuits of this type for selecting and memorising a given number of preferred channels is "station memory".

Many types of station memories are already being sold on the market which can be divided into two main groups: those with automatic and those with manual television channel searching.

The automatic types are fitted with electronic searching circuits which locate television channels automatically when started by the user. This is done by scanning a given band (VHF or UHF, for example) and stopping on the located channel. Data relative to the located channel can then be memorised by the user in a memory circuit and the same channel recalled whenever required by simply pressing a button which recalls the said data from the memory and supplies it to the channel selection circuit.

This type of circuit is also fitted with components which sense, during search, if a television channel has been tuned into and disable automatic searching to prevent television band scanning from continuing. Most of these circuits are fitted with a phase detector which senses the coincidence between the sync signals received and those regenerated in the receiver (in particular, the flyback signal).

Manual station memories, on the other hand, are fitted with controls which, when activated by the user, start a device for scanning a given television band. These controls also stop the said device when required by the user. When the user sees the required channel appear on the screen, the device is stopped to disable search and enable the channel to be memorised in the appropriate circuit.

In these cases, the simplest way of starting and stopping the search is to fit the circuits with a button which, when pressed, supplies a search-start signal and, when released, stops the searching operation. For best tuning, two buttons are usually provided for band scanning in both directions.

Both the types discussed up to now present drawbacks. In the case of automatic station memories, for example, tuning quality depends on correct operation of all the search-stop circuits and the automatic tuning circuit (AFC=automatic frequency control). Even in cases where these circuits are operating correctly, tuning could still be impaired by noise or amplitude distortion on the received signal.

Tuning quality on manual station memories, on the other hand, depends on the tuning ability of the user. Television receivers can be manipulated by anybody not all of whom are gifted with this ability. A further drawback of manual station memories is that the user has very little time in which to decide whether the received channel is the right one and to estimate tuning quality. If the whole television band is to be scanned in a reasonable length of time (let us say, the UHF band in one minute) band-scanning speed needs to be fairly high. Consequently, if the user is not quick enough in sending out the search-stop control signal, it is more than likely that the control will be sent when the required television channel has been overshot. If, by chance, there are two channels close to one another, the searching device may even stop on the second of the two, thus confusing the user who will not know which of the two channels he has tuned into.

The aim of the present invention is to provide a tuning device to overcome these problems.

With this aim in view, the present invention provides a television tuning device comprising a circuit for continuously scanning at least one band of receivable frequencies, manual control means for starting and stopping the said scanning procedure, a terminal for applying a switch signal for switching from a first band-scanning speed to a second band-scanning speed lower than the first, and detection means for detecting the presence of a television channel by comparing the received sync signals with local signals generated in the television receiver, and applying a switch signal to the said terminal for switching from the said first scanning speed to the said second scanning speed in the presence of the said switch signal, so that the band scanning continues at said lower speed until the manual control means produce the stopping scanning procedure.

Figure 1:
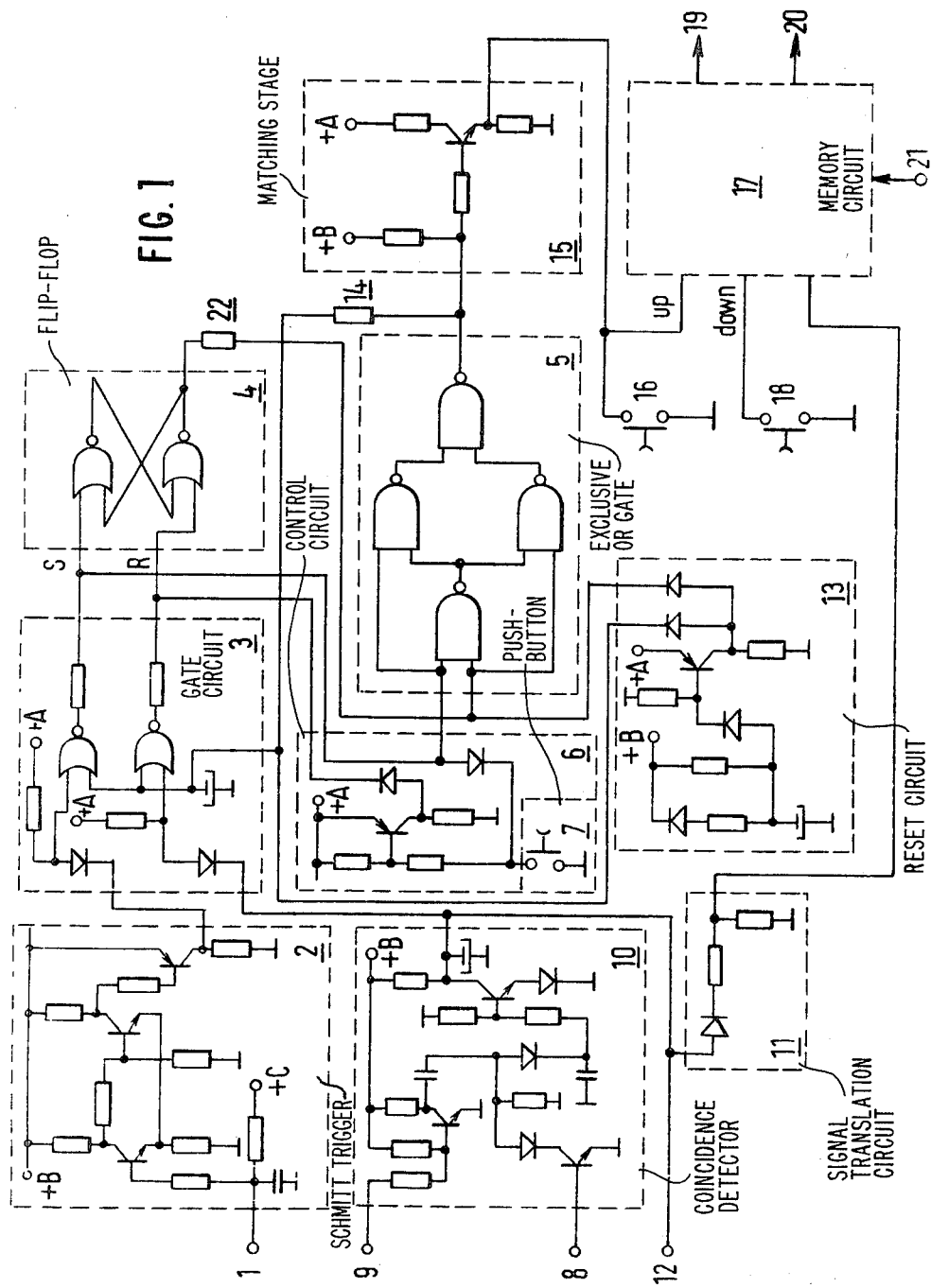
FIG. 1 shows a block and circuit diagram of an exemplary television tuning device according to the invention.

In the diagram, an input terminal receives an input signal from a frequency discriminating circuit, which forms part of a known automatic frequency control (AFC) circuit, the input signal being applied to a known Schmitt trigger circuit, generally designated 2. The output of circuit 2 is connected to a first input of a circuit 3 which has two outputs, one connected to set input S and one to reset input R of Flip Flop circuit 4. Input S of the said Flip Flop is also connected to a first input of an exclusive OR logic circuit 5 and a first output of a control circuit 6 which has a second output connected to input R of circuit 4 and an input connected to a terminal of a first push-button 7 the other terminal of which is grounded.

Number 8 represents an input for receiving line sync signals obtained in the known way from sync separating circuits, the signals being applied to a first input of a coincidence detecting circuit 10 the second input of which is connected to receive a line flyback pulse 9, obtained from the horizontal deflection circuits. The output of circuit 10 is connected to a signal translation circuit 11, the second input of circuit 3 and an output 12 which can be sent to activate the AFC circuits on the set. ON reset circuit 13 has a first output connected to the second input of circuit 5, which is also connected to the output of circuit 4 through disconnecting resistor 22, and a second output connected to the control input of circuit 3, which is also connected to the output of circuit 5 through resistor 14. The output of EX-OR circuit 5 is also connected to the input of matching stage 15 the output of which is connected to a second push-button 16 and a first control input (UP) of a tuning detection and memorising circuit 17. This has a second control (down) input connected to a third push-button 18. A detection speed switch input is connected to the output of circuit 11. Input 21 can be connected, in the known way, to a station keyboard, outputs 19 and 20 representing respectively the tuning voltage to be sent to the tuning circuit and the channel indication to be sent to an appropriate display, using known methods. Push-buttons 16 and 18 are the same as push-button 7 and therefore have their second terminals grounded.

The known station memory circuit 17 consists mainly of TEXAS INSTRUMENTS Ser. No. 76,720 and Ser. No. 76,727 integrated circuits, an amplifying transistor, a filter and passive components for piloting the said integrated circuits as recommended by the makers. Push-buttons 16 and 18 are connected to terminals 10 and 11 of integrated circuit Ser. No. 76,720 respectively. Input 21 is represented by terminals, 1, 15, 16, 17 and 18 of the same integrated circuit while terminal 13 is connected directly to the output of circuit 11. The components used for performing the required function are represented inside a number of the circuits already mentioned. The ratings of the resistors and condensers are shown directly in the diagram. The ratings of the remaining components are as shown in the Table below:

| NPN transistors | BC 148B |
|---|---|
| PNP transistors | BC 158B |
| Diodes | 1N4148 |
| NOR gates | ¼ F4001 (+ A supply) |
| NAND gates | ¼ F4011 (+ A supply) |
| + A | 5V |
| + B | 12.5V |
| + C | 33V |

The circuit operates as follows:

When one of the buttons on the television panel connected to inputs 21 of circuit 17 is pressed, the corresponding memory register in circuit 17 (I.C. Ser. No. 76,720) is activated to give a voltage at output 19 corresponding to the tuning voltage of a given television channel memorised previously. If a video signal is present, the horizontal deflection circuits on the set are synchronized by the sync signals in the received signal, coincidence detector circuit 10 supplies a high output voltage so that the AFC circuit comes into operation, controlled by output 12 for optimum tuning. In this case, the voltage at the output of stage 15 is high and circuit 17 undertakes no further operations to detect other emitting stations. The voltage at the output of EX-OR stage 5 is also high so that the circuit at gate 3 is kept closed, a situation which persists until one of the control buttons is pressed. By pressing other keys on the board, it is possible to tune into other stations memorised previously in the same way as described already. If there is no television signal present for the key pressed, circuit 10 detects no coincidence, its output remains low and the AFC circuit does not come into operation.

A second operation mode is possible by which a new emitting station can be searched manually using push-buttons 16 and 18. Keeping button 16 pressed, for example, station memory circuit 17 detects towards the higher frequency channels at increasing speed. Integrated circuit Ser. No. 76,720 has two different search speeds (one for VHF and one for UHF channels, for example). On the circuit referred to in the present invention, searching speed is determined by coincidence detector 10. If no coincidence is detected, that is if the search is performed in a frequency zone with no stations, the voltage at the output of circuit 10 and, consequently, also at the output of circuit 11 will be low so that searching is made at maximum speed. If a station is approached, however, circuit 10 switches so that a speed switch signal is sent to terminal 13 of integrated circuit Ser. No. 76,720. Operation of the integrated circuit is such that the search is continued at the minimum speed allowed by the system. This simplifies the tuning operation by allowing the user much more time than he would have had with the original station memory circuit 17. At the same time, no advantage is lost in terms of scanning speed over empty bands. In fact, this is always performed at maximum speed even over UHF bands. Optimum searching can be made by pressing buttons 16 and 18 alternately; this condition is automatically registered in the memory by integrated circuit Ser. No. 76,720.

A third mode of operation is possible in which searching and memorising are performed automatically. When button 7 is pressed, low and high voltages are applied, through circuit 6, to the set and reset inputs of Flip Flop 4 respectively so as to force the output to zero. Two zeroes are thus applied to EX-OR circuit 5 so as to create a low voltage at its output. In this way, the voltage at the output of circuit 15 moves to zero and circuit 17 starts searching upwards exactly in the same way as when button 16 was pressed. After a given interval, determined by resistor 14 and the condenser at the control input of circuit 3, this gate circuit opens so that the signals at its inputs can be sent to the inputs of Flip Flop 4. During the search, in the absence of any stations, the output of circuit 10 is low while that of trigger circuit 2 is high. This results in a 1 at the reset input and a 0 at the set input of the Flip Flop so that the output of circuit 15 remains low and the search is continued. As soon as a station is approached, on the video carrier side, given the searching direction chosen, the horizontal deflection circuits are synchronized with the signal, the coincidence detector supplies a high output and the AFT circuits become activated through output 12 to reduce searching speed (circuits 11 and 17).

The reset input of the Flip Flop moves to zero but the output remains unchanged and the search continues at low speed. Over time, the AFC voltage at input 1 describes a curve in the form of an S, that is it starts at zero, rises to a maximum, returns to zero (optimum tuning), reaches a minimum and then returns to zero.

When the threshold of trigger 2 is reached, the latter switches, that is, its output becomes low, Flip Flop inputs S and R become 1 and 0 and switching commences. For a time period equal to the delay of the Flip Flop, a 1-0 condition exists at the input of the EX-OR circuit so that its output presents a positive peak which stops searching for an instant. After the Flip Flop switches (high output) a 1-1 condition exists at the EX OR input so that the output becomes low and searching continues at minimum speed. When the falling AFC voltage crosses the trigger threshold again, the trigger output becomes high causing it to switch. Two zeroes are present at the Flip Flop input, therefore its output remains at 1 with a 1 and 0 at the EX OR input. The result is its output becomes high, searching is stopped on the required station and this tuning condition memorised automatically in circuit 17. Following the delay determined by resistor 14, gate circuit 3 closes and the tuning condition reached can no longer be disturbed. For searching to be continued, button 7 must be pressed after which the cycle is repeated in the same way.

To prevent the searching process being started up automatically during the transients when the receiver is turned on, in addition to the pre-biasing resistors at the NOR gate inputs of circuit 3 and the input of stage 15, circuit 13 is provided which, for a given time, depending on the delay introduced by the RC network connected to +E voltage, applies a high voltage to the EX OR circuit input and the control input of gate 3 so as to keep it disabled. Also, as Flip Flop 4 consists of two twin-input negative-feedback NOR gates, the logic 1 applied by the reset circuit to the EX OR input and then to the Flip Flop output is returned to the input of one of the NOR gates so as to set the Flip Flop at 1.

Figure 2:
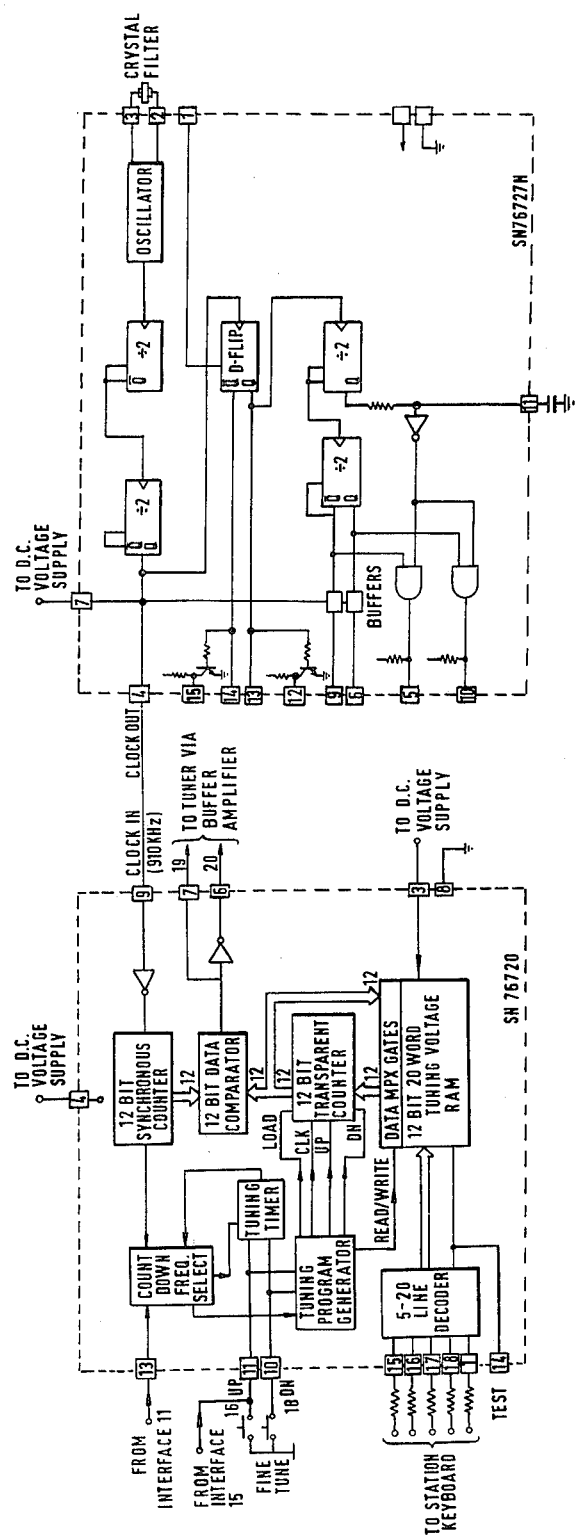
FIG. 2 shows the internal structure of exemplary integrated circuits used in the diagram of FIG. 1.

FIG. 2 shows the details of the integrated circuits used in the circuit of FIG. 1. The I.C. type Ser. No. 76,727 provides a clock signal to the other I.C. Ser. No. 76,720. This circuit features an oscillator which is controlled by an external crystal coupled to pins 2 and 3. A pair of cascaded divide-by-two flip-flops provide the proper clock signal at pin 4. A D-type flip-flop, which provides waveform shaping, is coupled to pin 4, and has both Q and $\overline{Q}$ output signals applied to pins 13 and 14 respectively. Two additional cascaded divide-by-two flip-flops are coupled to the Q output of the D-type flipflop and provide buffered output signals on pins 6 and 9 for driving a LED display (not shown). Two keyboard scanning output signals are provided at pins 5 and 10 which are in synchronization with the LED output signals at pins 6 and 9 but are narrowed and delayed to avoid edge coincidence glitches.

The station memory is Texas Instrument integrated circuit of the type Ser. No. 76,720 which receives the clock signal at its pin 9 and applies it to 12 bit synchronous counter. Pins 15 to 18 and 1 correspond to the input terminal 21 of the present invention and are intended to carry a five bit code identifying the manually selected channel. The signals are applied to 5 to 20 line decoder which in turn applies signals to a 12 bit tuning voltage RAM. The pins 10 and 11 are the up and down frequency scanning controls shown in FIG. 1 and the VHF/UHF pin 13 is also scanning speed controlled. The scanning is effected by transferring the data of the prevailing channel into the transparent counter and modifying this data under the control of the tuning program generator, the counter being clocked up or down at rate determined by the tuning timer and the countdown frequency select circuit. When one or the other buttons connected to the pins 10 and 11 is depressed, the count is incremented initially at a slower rate, the rate increasing gradually until it reaches a miximum level determined by the signal applied to pin 13.

The advantages of the circuit according to the present invention will be clear from the description given. First and foremost, as compared with known solutions, is the extra time allowed to the user for stopping the search when this is done manually. This is possible with no increase in the time taken for a complete band to be scanned. A further advantage is the possibility of two types of search: automatic and manual. The advantages of both operating modes are thus combined in one device to provide the best results. In particularly delicate cases, the user can leave aside automatic searching and perform the operation manually. A further advantage is that, when operating automatically the circuit described is provided with two circuits which, as optimum tuning is approached, both slow down band-scanning speed one after the other to facilitate operation of the automatic searching-stop $\frac{2}{3}$ circuit and recognition of correct tuning. One last advantage is that the arrangement described is particularly simple and economical considering the functions it performs. To those skilled in the art it will be clear that variations can be made to the circuit described without, however, departing from the scope of the present invention as defined in the claims. Of these we shall mention just a few. For example, the possibility of using only one type of search, e.g. manual. Another variation could be to use a different type of station memory, for example another of the "dedicated" integrated circuits available on the market or a station memory circuit made using a microprocessor. It should be pointed out that the circuits shown in the blocks on the diagram are only a few of the many types capable of performing the functions required and that numerous variations can be made to them.

I claim:

1. A television tuning device comprising a circuit scanning means for continuously scanning at least one band of receivable frequencies, manual control means for starting and stopping said scanning, a terminal means for applying a switch signal to said scanning means for switching from a first band-scanning speed to a second band-scanning speed lower than the first, and detection means for detecting the presence of a television channel by comparing received synchronization signals with local signals generated in the television receiver and for applying a switch signal to said terminal means for switching from said first band-scanning speed to said second band-scanning speed in the presence of said switch signal so that the band scanning continues at said second band-scanning speed until the manual control means stops the scanning.

2. A television tuning device according to claim 1, further comprising scanning stopping means for stopping the scanning automatically when a television channel has been correctly tuned in, speed reducing means for reducing band-scanning speed, and said detection means comprising first and second detecting means for detecting the presence of a television channel which act in sequence one after another for supplying to said speed reducing means control signals at successive instants so as to increase the effective time interval during which said scanning stopping means may operate.

3. A device according to claim 2, further comprising controlling means for controlling the tuning frequency of the receiver automatically for optimum tuning, said controlling means being activated or de-activated by said switch signal provided by the said detection means for detecting the presence of a television channel.

4. A device according to claim 1, in which said band-scanning circuit means includes means for generating scanning signals at increasing speed starting from the instant scanning commences, and means for stopping and restarting scanning when the presence of a television channel is detected so that scanning continues at the same speed as when it commenced.

5. A device according to claim 1, in which said detecting means includes a coincidence detector means for detecting coincidence between the synchronization signals received and picture tube deflection signals generated inside the television receiver.

6. A device according to claim 1, in which said manual control means includes two push-buttons, one for controlling commencement of band scanning from the lowest to the highest frequencies and the other for controlling commencement of band scanning in the opposite direction and in which scanning commences on pressing one of said buttons and stops upon release of the same button.

7. A device according to claim 3, in which said first detecting means for detecting the presence of a television channel includes a detector means for detecting coincidence between the synchronization signals of the received signal and picture tube deflection signals generated in the television receiver and said second detecting means includes a threshold comparator means for receiving the output signal of said controlling means and processing means for supplying by means of processing means a signal for stopping band scanning.

8. A device according to claim 7, in which said processing means are operative to supply a signal for restarting band scanning at the same speed at which it was commenced.

9. A device according to claim 7, in which said processing means includes a series circuit comprising a disabling circuit which receives the output signals of said first and second detecting means, a Flip Flop, and an exclusive OR logic circuit, which stop the scanning operation and prevent it from being continued until a new scanning-start signal is received from said controlling means and such as to reset the Flip Flop.

10. A device according to claim 9, further comprising means for resetting said series circuit when the receiver is turned on to prevent scanning from being commenced until the scanning-start signal is sent.

* * * * *